United States Patent
Linke et al.

(10) Patent No.: US 10,202,681 B2
(45) Date of Patent: Feb. 12, 2019

(54) COPPER-GALLIUM SPUTTERING TARGET

(71) Applicant: PLANSEE SE, Reutte (AT)

(72) Inventors: Christian Linke, Ehenbichl (AT); Thomas Scherer, Lechaschau (AT)

(73) Assignee: Plansee SE, Reutte (AT)

( * ) Notice: Subject to any disclaimer, the term of this patent is extended or adjusted under 35 U.S.C. 154(b) by 198 days.

(21) Appl. No.: 15/025,312

(22) PCT Filed: Sep. 26, 2014

(86) PCT No.: PCT/AT2014/000174
§ 371 (c)(1),
(2) Date: Mar. 28, 2016

(87) PCT Pub. No.: WO2015/042622
PCT Pub. Date: Apr. 2, 2015

(65) Prior Publication Data
US 2016/0230266 A1     Aug. 11, 2016

Related U.S. Application Data (60) Provisional application No. 61/883,555, filed on Sep. 27, 2013.

(51) Int. Cl.
| | |
|---|---|
| C23C 14/34 | (2006.01) |
| B22F 3/105 | (2006.01) |
| C22C 9/00 | (2006.01) |
| C22C 1/04 | (2006.01) |
| B22F 1/00 | (2006.01) |
| B22F 3/115 | (2006.01) |
| B22F 3/14 | (2006.01) |
| B22F 5/00 | (2006.01) |
| B22F 9/04 | (2006.01) |
| C22C 28/00 | (2006.01) |
| C23C 14/14 | (2006.01) |
| H01J 37/34 | (2006.01) |

(52) U.S. Cl.
CPC ........ *C23C 14/3414* (2013.01); *B22F 1/0003* (2013.01); *B22F 3/105* (2013.01); *B22F 3/115* (2013.01); *B22F 3/14* (2013.01); *B22F 5/00* (2013.01); *B22F 9/04* (2013.01); *C22C 1/0425* (2013.01); *C22C 1/0441* (2013.01); *C22C 1/0483* (2013.01); *C22C 9/00* (2013.01); *C22C 28/00* (2013.01); *C23C 14/14* (2013.01); *H01J 37/3423* (2013.01); *H01J 37/3429* (2013.01); *B22F 2301/05* (2013.01); *B22F 2301/10* (2013.01)

(58) Field of Classification Search
CPC ....................................................... C22C 9/00
See application file for complete search history.

(56) References Cited

U.S. PATENT DOCUMENTS

| | | |
|---|---|---|
| 2010/0307914 A1 | 12/2010 | Hiramoto et al. |
| 2011/0284372 A1 | 11/2011 | Hiramoto et al. |
| 2011/0290643 A1 | 12/2011 | Munteanu et al. |
| 2012/0217157 A1 | 8/2012 | Zhang et al. |
| 2013/0186745 A1 | 7/2013 | Nanis |
| 2013/0319527 A1 | 12/2013 | Tamura et al. |
| 2014/0048414 A1 | 2/2014 | Zhang et al. |
| 2014/0251801 A1* | 9/2014 | Zhang ............ C22C 9/00 204/298.13 |

FOREIGN PATENT DOCUMENTS

| | | |
|---|---|---|
| CN | 1719626 A | 1/2006 |
| CN | 101906552 A | 12/2010 |
| CN | 102395702 A | 3/2012 |
| CN | 103261473 A | 8/2013 |
| EP | 2666884 A1 | 11/2013 |
| JP | 2000073163 A | 7/2000 |
| JP | 2014051712 A | 3/2014 |
| WO | 2012098722 A1 | 7/2012 |
| WO | 2013054521 A1 | 4/2013 |
| WO | 2013095070 A1 | 6/2013 |

OTHER PUBLICATIONS

Rudmann, D., et al.; "Effects of NaF coevaporation on structural properties of Cu (In,Ga)Se2 thin films"; Thin Solid Films; Elsevier-Sequoia S.A. Lausanne, CH; Bd. 431-432, May 1, 2003 (May 1, 2003); pp. 37-40; XP004428602.

Muqin Li et al., "Material Surface Engineering", Chemical Industry Press, Aug. 31, 2010, pp. 67-68—English abstract.

Jiping Zhu et al., "Synthesis and Preparation of Inorganic Materials", Hefei University of Technology Press, Dec. 31, 2009, pp. 166-168—English abstract.

* cited by examiner

*Primary Examiner* — Jessee R Roe
(74) *Attorney, Agent, or Firm* — Laurence A. Greenberg; Werner H. Stemer; Ralph E. Locher (57) ABSTRACT

A Ga-containing and Cu-containing sputtering target has a Ga content of from 30 to 68 at %. The sputtering target contains only $CuGa_2$ as Ga-containing and Cu-containing intermetallic phase or the proportion by volume of $CuGa_2$ is greater than the proportion by volume of $Cu_9Ga_4$. The sputtering target is advantageously produced by spark plasma sintering or cold gas spraying. Compared to $Cu_9Ga_4$, $CuGa_2$ is very soft, which aids the production of defect-free sputtering targets having homogeneous sputtering behavior.

10 Claims, 2 Drawing Sheets

COPPER-GALLIUM SPUTTERING TARGET

BACKGROUND OF THE INVENTION

Field of the Invention

The invention relates to a sputtering target which has a gallium (Ga) content of from 30 to 68 at % and comprises a phase containing Ga and copper (Cu). The invention further relates to a process for the production thereof. In addition, the invention relates to the use of a sputtering target.

Cu—Ga sputtering targets are, for example, used for producing copper-indium-gallium diselenide (Cu(In, Ga) (Se,S)$_2$, referred to as CIGS for short) thin films. CIGS thin films have a high absorption capability and are therefore a promising semiconductor material for the absorber layer of thin film solar cells. The band gap energy can be adapted by varying the Ga concentration and ranges from about 1 eV for the ternary CuInSe$_2$ to about 1.7 eV for the ternary CuGaS$_2$. Doping with alkali metals makes it possible to achieve an improvement in the solar cell properties, especially the efficiency, although the precise mechanism of the effect has not yet been conclusively established.

Various methods are used for producing the p-doped absorber layer. Sputtering processes are becoming evermore established here. When Cu—Ga and In sputtering targets are used, cosputtering or sequential sputtering is typically employed. The microstructure of the Cu—Ga sputtering target is of great importance here. Cu—Ga sputtering targets can in principle be produced by melting or by a powder metallurgical route. Processes involving melting are, however, suitable only for low Ga contents since the intermetallic phases resulting from relatively high Ga contents combined with the coarse microstructure resulting from the method of production lead to significant embrittlement of the material. The embrittlement can, inter alia, be associated with defects in the material, e.g. macrocracks and microcracks. These defects and also process-related Ga-rich segregations have an adverse effect on the sputtering behaviour and thus also on the quality of the thin films.

Hot isostatic pressing (HIP) and hot pressing (HP) are customary for the powder-metallurgical production of Cu—Ga sputtering targets. However, these process techniques also require high process temperatures or long process times, as a result of which the formation of brittle intermetallic phases cannot be avoided at Ga contents of >30 at %.

Sputtering targets having a high Ga content are described in, for example, JP 2014051712, WO 201298722, US 20110284372, CN 101906552, CN 1719626 and JP 2000073163. The general consensus in these is that phases in which Ga is the predominant element should be avoided. For the purposes of the invention, "predominant element" is the element which has the highest content in the alloy. Due to the production method, gamma phase (γ-phase), which due to its low Ga content (about 34 to 43 at %) is also desirable, is formed in sputtering targets according to these documents.

Figure 1:
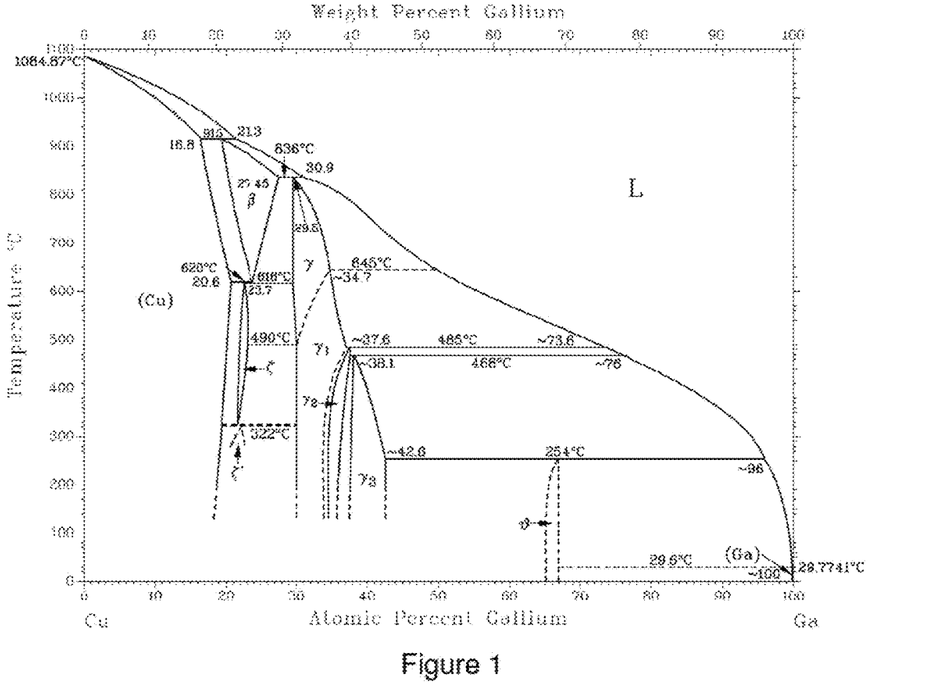
FIG. 1 shows the Cu—Ga phase diagram (source: Subramanian P. R., Laughlin D. E.: ASM Alloy Phase Diagrams Center, P. Villars, editor-in-chief; H. Okamoto and K. Cenzual, section editors).

For the purposes of the invention, the following modifications are subsumed under the term γ-phase (for phase diagram, see FIG. 1):
high-temperature modification γ (Cu$_9$Ga$_4$)
γ$_1$-phase (Cu$_9$Ga$_4$)
γ$_2$-phase (Cu$_{8.45}$Ga$_{4.55}$)
γ$_3$-phase (Cu$_{7.5}$Ga$_{5.85}$)
The high-temperature modifications γ, γ$_1$, γ$_2$ and γ$_3$ are collectively referred to as Cu$_9$Ga$_4$ in the further text.

At Ga contents above 55 at %, CuGa$_2$, also referred to as theta phase (θ-phase) would be formed as predominant Cu—Ga phase according to the equilibrium diagram. For the purposes of the invention, "predominant Cu—Ga phase" refers to the Cu—Ga phase which has the highest proportion of all Cu—Ga phases. The designation CuGa$_2$ will be employed for the θ-phase throughout the further text.

CuGa$_2$ and Cu$_9$Ga$_4$ are intermetallic phases. In contrast to alloys, intermetallic phases have lattice structures which differ from the metals of which they are constituted. There is usually mixed bonding having a metallic bonding component and smaller atomic bonding and ionic bonding components.

CuGa$_2$ phase formation occurs on cooling from temperatures of >254° C. by means of a peritectic transformation (Cu$_9$Ga$_4$+melt (Ga content of the melt=about 95 at %)→CuGa$_2$). However, this peritectic reaction does not proceed to equilibrium under customary cooling conditions, but instead the suppressed outward diffusion of Cu from the Cu$_9$Ga$_4$ phase leads to a Ga-rich (Ga content 75 at % and above) nonequilibrium phase. This nonequilibrium phase (often also referred to as segregation phase) surrounds the Cu$_9$Ga$_4$ grains. The proportion of Cu$_9$Ga$_4$ phase is significantly higher than would be expected under equilibrium conditions. The Ga-rich nonequilibrium phase can lead to local melting in the sputtering process since the melting point of this phase is very low.

Apart from the production of Cu—Ga sputtering targets by melting, HIP and HP, compacting by cold gas spraying (CGS) has also been described. CGS is a coating process in which a process gas is accelerated to high velocity by expansion in a convergent-divergent nozzle, also referred to as ultrasonic nozzle (for example Laval nozzle). The powder particles (coating material) are injected into this process gas jet and accelerated to such a high velocity that they form a dense and firmly adhering layer on impingement on a substrate even without prior partial melting or melting, in contrast to other thermal spraying processes. The velocity here depends greatly on the process gas used (for example nitrogen (N) or helium (He)) and on the process gas temperature. When using N, gas velocities of, for example, 900 m/s are possible, and when using He velocities of 2500 m/s are possible. The coating material is typically accelerated to a velocity of from 300 to 1200 m/s.

CGS of Cu—Ga sputtering targets is described in WO 201395070 and WO 201354521. In the case of Cu—Ga sputtering targets having a high Ga content, a powder in which Ga is present mainly as Cu$_9$Ga$_4$ is used as coating material even in the case of CGS. Cu$_9$Ga$_4$ has a very high hardness (penetration hardness H$_{IT}$=about 7.6 GPa). This high hardness leads to sputtering targets produced in this way having an unsatisfactory density, pores, grain boundary cracks and/or other microstructural defects. This in turn has an adverse effect on the workability and sputtering behaviour of the sputtering target.

BRIEF SUMMARY OF THE INVENTION

It is therefore an object of the invention to provide a sputtering target which does not have the abovementioned disadvantages. In particular, it is an object of the invention to provide a sputtering target which has at least one of the following properties:
uniform and constant sputtering behaviour
no or very little local electric arc formation at defects, for example pores and cracks, during sputtering no regions having a Ga content of >about 75 at % and thus avoidance of local partial melting during sputtering good mechanical workability low internal stresses and thus no or very little distortion during sputtering good bonding behaviour simple recycling low costs.

Furthermore, a process by means of which inexpensive and reliable production of sputtering targets having the properties indicated above is possible should be provided.

In addition, the invention should encompass a use of the sputtering target, in which the abovementioned properties of the sputtering target can be utilized particularly advantageously.

The objects of the invention are achieved by the independent claims. Particularly advantageous embodiments are indicated in the dependent claims.

The sputtering target has a Ga content of from 30 to 68 at %, preferably from 40 to 68 at %.

The object of the invention is achieved by the following two alternatives:

1. The sputtering target contains only $CuGa_2$ as Cu- and Ga-containing intermetallic phase or the proportion by volume of $CuGa_2$ is greater than the proportion by volume of $Cu_9Ga_4$.

2. The sputtering target has an average microhardness of <500 HV0.01 in regions comprising Ga- and Cu-containing intermetallic phase.

In a particularly advantageous embodiment, the sputtering target has the features of both alternatives 1 and 2.

Furthermore, the volume ratio of $CuGa_2$ to $Cu_9Ga_4$ is preferably >2, particularly preferably >5. The proportions of $CuGa_2$ and $Cu_9Ga_4$ phase are determined on a polished section by means of BSE-SEM (SEM . . . scanning electron microscope, BSE . . . backscattered electrons) at a magnification of 1000 (reference size is the Polaroid 545 format). Chemical phase discrimination is firstly carried out by EDX. Image analysis is restricted to $CuGa_2$ and $Cu_9Ga_4$ phase. All other constituents of the microstructure (Cu grains, Cu mixed crystal grains, pores, . . . ) are excluded. To distinguish $Cu_9Ga_4$ and $CuGa_2$ grains, the image is binarized by means of the threshold value method. In this way, it is possible to determine the proportions by area of $Cu_9Ga_4$ and $CuGa_2$. The determination of the proportions of the phases is repeated at two further places and the average is calculated. The identical measurement procedure is then repeated on a further polished section which has a polished surface rotated by 90° relative to the first series of specimens (90° rotation/rotational axis perpendicular to the sputtering surface of the target) and also on a polished section having a polished surface parallel to the sputtering surface. The average of the proportions by area of the $Cu_9Ga_4$ or $CuGa_2$ phase from these 3 series of specimens is equated to the volume content thereof.

According to the invention, the predominant intermetallic phase is $CuGa_2$. $CuGa_2$ is a very thermodynamically stable intermetallic compound which melts incongruently at 254° C. According to the Cu—Ga phase diagram (see FIG. 1), the $CuGa_2$ phase has a homogeneity region. It follows from this that the $CuGa_2$ phase can have both a lower content of Cu or Ga and a higher content of Cu or Ga than corresponds to the stoichiometric compound $CuGa_2$.

Intermetallic phases typically have a very high hardness, strength and brittleness, as is also the case, for example, for $Cu_9Ga_4$ (microhardness about 720 HV0.01). Sputtering targets containing $CuGa_2$ then very surprisingly have a significantly lower hardness. The sputtering target thus also has high ductility and therefore excellent mechanical workability.

As mentioned, the advantages according to the invention are preferably also achieved when the average microhardness in regions comprising Ga- and Cu-containing intermetallic phase is <500 HV0.01. The average microhardness is preferably <400 HV0.01, particularly preferably <300 HV0.01. As the examples show, very preferred values of <200 HV0.01 can also be achieved.

The average microhardness is determined as follows. Firstly, a polished section is produced and the microhardness is determined on the polished surface. Assignment of the phases is carried out by optical differentiation, optionally with the aid of prior phase discrimination by means of EDX. The measurement of the microhardness of the Cu—Ga-containing intermetallic phase is carried out in accordance with ISO 6507-1:2005. The hardness value is preferably based on specimens which have not been subjected to any additional after-treatment such as heat treatment. Three indentations are made in each of 10 different regions comprising intermetallic Cu—Ga phase and the average is determined.

Preference is given to at least 90% of the Ga present in the sputtering target being present as $CuGa_2$ phase. <10% can therefore also be present in another form (Cu—Ga mixed crystal, other intermetallic Cu—Ga phases). This parameter is determined as follows. Firstly, the total Ga content of the sputtering target is determined by chemical analysis of 5 samples by means of ICP-OES and formation of the average. The proportion by volume of $CuGa_2$ is then determined by means of BSE-SEM using the measurement sequence indicated above. The Ga content which is present as $CuGa_2$ is determined from the proportion by volume of $CuGa_2$. This content is divided by the total content of Ga in the sputtering target and the proportion of the Ga present as $CuGa_2$ is thus calculated.

If the Ga content of the sputtering target is in the homogeneity region of the $CuGa_2$ phase (from about 64 to about 68 at %), then the total Cu and Ga is preferably present as $CuGa_2$. If the Ga content is below about 64 at %, the sputtering target contains not only $CuGa_2$ but advantageously also a Cu-rich phase having a Cu content of >80 at %, preferably >90 at % and particularly preferably >95 at %. This ensures that the Cu-rich phase has a high deformation capability. The Cu-rich phase is preferably Ga-containing Cu mixed crystal or pure Cu. The best results could be achieved when the Cu-rich phase is pure Cu. For the purposes of the present invention, pure Cu is Cu having usual impurities.

Taking into account the phases containing only Ga- and Cu, the following preferred possibilities present themselves for the phase composition of the sputtering target:

only $CuGa_2$ $CuGa_2$+pure Cu $CuGa_2$+Ga-containing Cu mixed crystal $CuGa_2$+pure Cu+Ga-containing Cu mixed crystal $CuGa_2$+other intermetallic Cu—Ga phase(s)

$CuGa_2$+pure Cu+other intermetallic Cu—Ga phase(s)

$CuGa_2$+Ga-containing Cu mixed crystal+other intermetallic Cu—Ga phase(s)

or $CuGa_2$+pure Cu+Ga-containing Cu mixed crystal+other intermetallic Cu—Ga phase(s).

The sputtering target advantageously comprises >30% by volume, preferably >60% by volume, particularly preferably >90% by volume, of $CuGa_2$. The proportion of further intermetallic Cu—Ga phases, in particular $Cu_9Ga_4$, is advantageously <15% by volume, preferably <10% by volume and particularly preferably <5% by volume. As can be seen from the examples, it is possible and very advantageous to produce sputtering targets in which no $Cu_9Ga_4$ can be detected by means of BSE-SEM.

A sputtering target in which $CuGa_2$ is the Cu- and Ga-containing intermetallic phase present in the largest proportion surprisingly has very homogeneous sputtering properties. In addition, the sputtering targets of the invention can be produced simply, inexpensively and reliably, as will be explained in detail in the examples. The sputtering targets are free of pores and cracks, as a result of which local electric arc formation at defects is avoided during sputtering. There is no segregation phase (Ga content>about 75 at %) which can lead to local partial melting during sputtering. Since $CuGa_2$ is very soft, sputtering targets can be compacted even at comparatively low temperatures. As a result, grain boundary segregation can be reliably avoided. In addition, the sputtering targets display very good mechanical workability, which in turn has an advantageous effect on the production costs and surface quality. Since all participating phases have a low yield point, internal stresses are low. This has an advantageous effect on the dimensional stability of the sputtering target during use, since the unsymmetrically released stresses caused by one-sided removal of material during sputtering are low. The sputtering targets can be recycled in a simple manner by melting. The Ga concentration of the melt is preferably set to the appropriate intended value by addition of pure Ga to the alloy. A Ga content of from 64 to 68 at % is advantageously selected here. Thus, for example, $CuGa_2$ powder which can in turn be used for the production of new sputtering targets can be produced by means of a conventional atomization process.

In addition, the sputtering target can also contain from 0.01 to 5 at % of at least one element from the group of alkali metals. If a plurality of alkali metals are present, from 0.01 to 5 at % represents the total content. Preferred alkali metals are Li, Na and K. As mentioned above, alkali metals have a favourable effect of the efficiency of the CIGS thin film solar cell. As particularly advantageous alkali metal, mention may be made of Na, and advantageous Na compounds are $Na_2SO_4$ and NaCl. The sputtering target therefore preferably consists of from 30 to 68 at % of Ga, preferably from 40 to 68 at % of Ga, optionally one or more alkali metal(s) or one or more alkali metal compound(s), where the alkali metal content of the sputtering target is from 0.01 to 5 at %, balance Cu and usual impurities. If the sputtering target contains an alkali metal compound, it contains not only the alkali metal but also the further elements of the compound, for example S, Cl and/or O. Among the abovementioned usual impurities, particular mention may be made of Fe, N, O and C which get into the sputtering target via the Cu—Ga or Cu powder. Typical O contents in the Cu or Cu—Ga powder are from about 500 to 1500 μg/g.

Since both $CuGa_2$ and also the Cu-rich phase can be compacted or densified very simply and efficiently, the sputtering target of the invention has a very high density. The relative density (reference parameter=theoretical density) is preferably >85%, particularly preferably >90%. It has been found that very advantageous relative density values of 95% and above can also be achieved.

To obtain a particularly uniform sputtering behaviour, it is advantageous for $CuGa_2$ to have an average grain size measured in the polished section of <150 μm, preferably <90 μm, in particularly preferably <30 μm. Since the production techniques according to the invention preferably proceed without nonvariant phase transformations and also do not lead to any grain growth, the size and shape of the $CuGa_2$ grains is determined mainly by the particle size and shape of the $CuGa_2$ powder used. Since spherical powder is preferably used, the grains in the polished section preferably have a round shape. The size and shape of the Cu-rich phase can also be controlled via the particle size of the pure Cu— or Cu mixed crystal powder used, with the average grain size of the pure Cu or Cu mixed crystal phase in the sputtering target preferably being <150 μm, particularly preferably <100 μm. A very advantageous grain size of <50 μm can also be set by means of very fine starting material. Since the Cu powder preferably also has a spherical shape, the Cu grains are also preferably round. Shape and size of the $CuGa_2$ grains and/or the pure Cu or Cu mixed crystal grains have a favourable effect on the workability of the sputtering target. The pure Cu or Cu mixed crystal grains are preferably embedded in a matrix composed of intermetallic Cu—Ga phase.

Furthermore, the sputtering target is preferably in the form of a flat or tubular target, with the latter representing a particularly advantageous embodiment of the present invention.

The object of the invention is also achieved by a process for producing sputtering targets having a Ga content of from 30 to 68 at %, preferably from 40 to 68 at %. This process is particularly advantageously suitable for producing the sputtering targets of the invention.

The process has at least the following steps
production of a powder mixture comprising $CuGa_2$-containing particles
and
compacting of the powder mixture.

The qualitative determination to find whether a particle contains $CuGa_2$ can be carried out both by means of XRD and by means of EDX. For the XRD measurement, the following JCPDS numbers were used for the phase assignment:
$CuGa_2$: 00-025-0275
$Cu_9Ga_4$: 00-002-1253
Cu: 00-004-0836

The quantitative phase analysis is carried out by means of XRD using an internal standard. The proportions of $CuGa_2$ and $Cu_9Ga_4$ are determined by intensity comparison.

Furthermore, the process preferably has at least one feature from the following listing:
The powder mixture contains pure Cu and/or Cu mixed crystal particles.
The powder mixture contains particles containing alkali metal.
The $CuGa_2$-containing particles have a maximum or a plurality of maxima of a hardness distribution in the regions comprising intermetallic Cu—Ga phase, with at least one maximum being at an indentation hardness $H_{IT}$ of <4.5 GPa.
The $CuGa_2$-containing particles contain only $CuGa_2$ or the proportion by volume of $CuGa_2$ is greater than the proportion by volume of $Cu_9Ga_4$.
Compacting is effected by sintering with application of a pressure and of an electric field for at least part of the time.
Direct current is passed through the powder mixture by action of the electric field.
The powder mixture is heated to a sintering temperature of from 150 to 250° C.

The time in the temperature range>50° C. is <60 minutes.

Compacting is effected by cold gas spraying.

In cold gas spraying, a process gas at a pressure of >10 bar is accelerated in a convergent-divergent nozzle, with the powder mixture being injected into the process gas upstream, into or downstream of the convergent-divergent nozzle, accelerated there and deposited on a substrate, to form a contact body.

The substrate is configured so that the compact body forms a tubular target, with the substrate performing the function of a support tube.

The determination of the indentation hardness $H_{IT}$ is carried out as follows. A powder polished section is firstly prepared. The measurement of the indentation hardness is carried out in accordance with ISO 14577 (2002 version) using a Berkovich indentation body and the evaluation method of Oliver and Pharr. The hardness value relates to specimens which preferably had not been subjected to any additional after-treatment such as heat treatment. Since the intermetallic Cu—Ga phase (white to light-grey colour) can clearly be distinguished even under an optical microscope from pure Cu or Cu mixed crystal (in each case bronze-coloured), the hardness indentations can be placed only in the intermetallic Cu—Ga phase.

The determination of the average indentation hardness is carried out under the following conditions:
Force: 2.8 mN
Force buildup time: 5 s
Time at force: 2 s
Time for removal of the force: 5 s A hardness grid is placed in each of different regions comprising intermetallic Cu—Ga phase. If the intermetallic Cu—Ga phase regions have a sufficient size, length and width of the grid field are 10 μm. The distance between the indentations is 2 μm, so that 25 indentations are made per grid field. This procedure is carried out on a total of 10 intermetallic Cu—Ga phase regions. A hardness frequency distribution is produced from the 250 indentation hardness values determined in this way. The regions comprising intermetallic Cu—Ga phase preferably have a maximum or a plurality of maxima of the hardness distribution, with at least one maximum being at an indentation hardness $H_{IT}$ of <4.5 GPa. It is advantageous for there to be at least one maximum at an indentation hardness $H_{IT}$ at <4 GPa, particularly preferably at <3 GPa. In the case of very small intermetallic Cu—Ga regions, the grid size is appropriately reduced. The distance between the indentations is left at 2 μm. The number of intermetallic Cu—Ga phase regions measured is selected so that the total indentation hardness values is once again 250.

The process of the invention comprises compaction of the powder mixture. Compaction is preferably carried out under conditions under which very little diffusion can take place. This prevents, in the case of an alloy composition which according to the phase diagram would contain $Cu_9Ga_4$ in the equilibrium, obtained, for example, from a mixture of $CuGa_2$ and Cu powders, the phase corresponding to the equilibrium being able to form to an unacceptably high extent. Particularly preferred compaction techniques are spark plasma sintering and cold gas spraying. As the examples show, no $Cu_9Ga_4$ corresponding to the equilibrium is formed when using a $CuGa_2$+pure Cu mixture when these process techniques are employed.

Spark plasma sintering (SPS) is also known under the synonyms "field activated sintering" (FAST) or direct current sintering. Densification is in this case effected with application of a pressure and an electric field for at least part of the time. The action of the electric field preferably results in direct current being passed through the powder mixture, as a result of which heating occurs in the powder mixture due to the Joule effect. The sintering temperature is preferably from 50 to <peritectic temperature (=about 254° C.), particularly preferably from 150 to 250° C. The pressure is advantageously from 5 to 400 MPa, preferably from 10 to 200 MPa, particularly preferably from 15 to 100 MPa.

In SPS, the powder mixture is introduced into a graphite crucible and compacted by means of two graphite punches. Direct current is advantageously also passed through the graphite crucible and the graphite punch by action of the electric field, resulting in heating due to the Joule effect also occurring in the graphite. The low hardness of the powder makes it possible to achieve very high densities at comparatively low temperatures and pressures. The rapid heating to sintering temperature made possible by SPS combined with the very efficient densification process make it possible to keep the times at a temperature (=>50° C.) at which diffusion can take place very short. This time is advantageously <60 minutes, preferably <30 minutes and particularly preferably <15 minutes. Since diffusion and thus formation of $Cu_9Ga_4$ is determined by temperature and time according to the Arrhenius relationship, relatively long times (>60 minutes) are advantageous when the sintering temperature required for densification is low, which is the case, for example, at a high pressure.

A further very advantageous compaction method is cold gas spraying (CGS). For this purpose, a plurality of layers of the coating are deposited on a substrate. After deposition of the layer, the substrate can be removed or else, in a preferred embodiment of the invention, function as backplate or support tube for the sputtering target. Preferred substrate materials which may be mentioned are, in particular, Cu and Cu alloys. The powder mixture (=the coating material) according to the invention is preferably injected into a process gas (for example $N_2$, air, He or mixtures thereof) upstream of, into or downstream of a convergent-divergent nozzle. A typical nozzle shape is the Laval nozzle. The process gas preferably has a pressure of greater than 10 bar, advantageously at least 20 bar and particularly preferably at least 30 bar. Advantageous ranges are from 10 to 100 bar, preferably from 20 to 80 bar and particularly preferably from 30 to 60 bar. The upper limit to the pressure range is partly determined by the plants available at present. Should plants which allow a higher gas pressure be available in the future, the limit can shift appropriately to a higher pressure. Depending on the process gas used, gas velocities of, for example, from 900 m/s (in the case of N) to 2500 m/s (in the case of He) can be achieved. The coating material is here typically accelerated to a velocity of from 300 to 1200 m/s. Heating of the gas upstream of the convergent-divergent nozzle increases the flow velocity of the gas when the gas is expanded in the nozzle and thus also increases the particle velocity.

The adhesion of the coating material to the substrate material and the cohesion between the particles of the coating material are critical to the quality of a sputtering target produced by CGS. In principle, the adhesion both in the region of the coating material/substrate interface and also between the particles of the coating material is an interplay of a plurality of physical and chemical adhesion mechanisms and is sometimes still not comprehensively understood. Important requirements which a sputtering target produced by CGS has to meet, for example, good adhesion between the individual layers of the coating, low porosity and satisfactory grain boundary strength, are satisfied to different degrees by various coating materials. The use of a powder mixture comprising particles which comprise intermetallic Cu—Ga phase and have a low indentation hardness and advantageously contain sufficient $CuGa_2$ leads to sputtering targets which have a very uniform sputtering behaviour, do not tend to display local electric arc formation, do not have any regions having a Ga content of >75 at % (no local partial melting during sputtering) and can be worked very well mechanically. Further advantages are the low production cost and simple recycling.

The mechanism by which the powder mixture of the invention affects the layer quality is not yet understood in detail. However, it can be assumed that an interplay of a plurality of mechanisms plays a role, for example reduction of the flow stress, promotion of microplastic flow processes, low consolidation or improved particle spread in the case of impact.

In the case of brittle materials, the particle size of the coating materials has to date been kept very small and/or He has been used as process gas because only in this way could the particle velocity necessary for adhesion be achieved. However, very fine powders have a high O content, which can have a disadvantageous effect on the efficiency in the case of CIGS solar cells. Furthermore, fine powders can lead to blocking of the powder transport systems since their flow behaviour is poor. In addition, particle bonding on impact on the substrate is poorer in the case of powders having a very small particle size than in the case of coarser powder. The size effects are based on dynamic effects such as the very rapid equalization of the heat evolved locally at the interface on impact and also on a higher dynamic strength due to strain rate consolidation. The powder mixture according to the invention now makes it possible to obtain a sputtering target having a high quality even when using an inexpensive process gas and powders having satisfactorily good flow behaviour. The sputtering targets of the invention can be deposited not only by means of the process gas He, which as mentioned above leads to a higher particle velocity, but also advantageously when using N-containing process gas, with the N content advantageously being >50% by volume, preferably >90% by volume. The process gas N is particularly preferably used without mixing with other gases. The use of N allows economical implementation of the invention.

The process gas can advantageously be passed through at least one heater upstream of the convergent-divergent nozzle. This can increase the gas velocity and thus also the particle velocity further, which in turn has an advantageous effect on properties of the compacted body. It should be ensured here that the particle temperature remains below 254° C. (=eutectic temperature).

Owing to the low process temperature and the short time at high temperature, the process of the invention enables alkali metals or compounds containing alkali metals to be incorporated in a very fine distribution in the sputtering target. As particularly preferred alkali metal, special mention may be made of Na, and $Na_2SO_4$ and NaCl may be mentioned as particularly advantageous Na-containing compounds. The short process time and low process temperature prevent undesirable reactions between the alkali metal/the compound containing alkali metal and Cu or Ga.

The process of the invention makes it possible to produce, in a simple way, not only a flat target but also a tubular target. Cold gas spraying is particularly suitable for producing tubular targets. For this purpose, a tube is preferably used as substrate. The tubular substrate particularly preferably represents the support tube of the sputtering target. In this way, tubular targets which are joined to the support tube can be produced in a simple manner.

After the compaction process, only minor mechanical working is required. A heat treatment can optionally also be carried out in order to reduce any internal stresses. The heat treatment is advantageously carried out before the mechanical working.

The sputtering target produced by the process of the invention preferably has at least one of the following properties.

The proportion by volume of $CuGa_2$ is greater than the proportion by volume of $Cu_9Ga_4$.

The average microhardness in regions comprising Ga- and Cu-containing intermetallic phase is <500 HV0.01, preferably <400 HV0.01, particularly preferably <300 HV0.01, in particular <200 HV0.01.

90% of the Ga is present as $CuGa_2$.

The Ga content is from 40 to 68 at %.

The sputtering target contains a Cu-rich phase which has a Cu content of >80 at % and is selected from the group consisting of pure Cu and Ga-containing Cu mixed crystal.

The Cu-rich phase is pure Cu.

The sputtering target contains <15% by volume, advantageously <10% by volume, preferably <5% by volume and particularly preferably no $Cu_9Ga_4$.

The sputtering target contains >30% by volume of $CuGa_2$, preferably >60% by volume, particularly preferably >90% by volume.

The $CuGa_2/Cu_9Ga_4$ volume ratio is >2, preferably >5.

$CuGa_2$ is present in the form of round grains having an average grain size of <150 μm in the polished section.

The Cu-rich phase is present in the form of round grains which have an average grain size of <150 μm and are embedded in a Cu—Ga matrix in the polished section.

The sputtering target contains from 0.01 to 5 at % of alkali metal, preferably Na.

The sputtering target consists of:
from 30 to 68 at % of Ga, preferably from 40 to 68 at % of Ga,
optionally one or more alkali metal(s) or one or more alkali metal compound(s), where the alkali metal content of the sputtering target is from 0.01 to 5 at %, balance Cu and usual impurities.

The sputtering targets of the invention are particularly suitable for producing a thin film of a solar cell. $CuGa_2$ can surprisingly also be found in the layer deposited by sputtering. The mechanism by which $CuGa_2$ is incorporated into the layer is not yet understood. It would be possible for $CuGa_2$ to be sputtered as molecule and also be incorporated as molecule into the layer. However, it would also be possible for Cu and Ga to be sputtered in atomic form but recombining to form the thermodynamically stable $CuGa_2$ on deposition.

The invention is described by way of example below.

DESCRIPTION OF THE INVENTION

The specimens were produced from the following powders:

Cu—Ga powder comprising 60% by mass of Cu and 40% by mass of Ga (60% by mass of Cu correspond to 62.20 at %, 40% by mass of Ga correspond to 37.80 at %; the powder will be referred to as Cu62Ga38 in the further text): for production of the comparative specimens Cu—Ga powder comprising 48% by mass of Cu and 52% by mass of Ga (48% by mass of Cu correspond to 50.32 at %, 52% by mass of Ga correspond to 49.68 at %; the powder will be referred to as Cu50Ga50 in the further text): for production of the specimens according to the invention Cu—Ga powder comprising 32% by mass of Cu and 68% by mass of Ga (32% by mass of Cu correspond to 34.05 at %, 68% by mass of Ga correspond to 65.95 at %; the powder will be referred to as Cu34Ga66 in the further text): for production of the specimens according to the invention.

Figure 2:
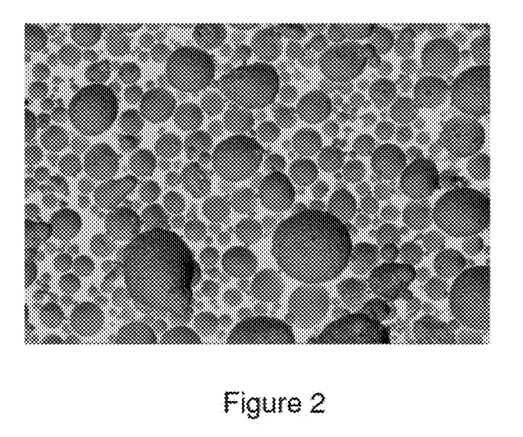
FIG. 2 shows a scanning electron micrograph of Cu—Ga powder according to the invention having a Ga content of 66 at %, balance Cu.

The powders were produced by atomizing a melt by means of Ar. The bulk density, tapped density, flowability, particle size determined by the Fisher method (FSSS) and the particle size ($d_{0.10}$, $d_{0.50}$, $d_{0.90}$) measured by laser light scattering were determined on the powders. The measured values are shown in Table 1. All powders have a spherical shape due to the production process (for $Cu_{34}Ga_{66}$ powder, see FIG. 2). GDMS analyses were carried out to determine the trace elements. The gas contents and C contents were determined by means of hot extraction and combustion analysis, respectively. Impurities warranting mention are oxygen ($Cu_{62}Ga_{38}$: 1186 µg/g, $Cu_{50}Ga_{50}$ 1064 µg/g and $Cu_{34}Ga_{66}$ 1266 µg/g). The C content of the samples was in the range from 8 to 18 µg/g, and the H content was in the range from 41 to 59 µg/g. All other impurities had values below 50 µg/g. The indentation hardness $H_{IT}$ was determined on powder polished sections. The measurement was carried out in accordance with ISO 14577 (2002 version) using a Berkovich indentation body, the evaluation method according to Oliver and Pharr and the procedure as described in detail in the description.

$Cu_{62}Ga_{38}$ has only one maximum of the indentation hardness at 7.7 GPa. $Cu_{50}Ga_{50}$ has two maxima at 3 GPa and 7.5 GPa. $Cu_{34}Ga_{66}$ displays a maximum at 2.8 GPa.

In the case of large particles in the upper region of the particle size distribution, it is also possible to measure the microhardness $HV_{0.01}$. A value of 719 $HV_{0.01}$ was measured in the case of $Cu_{62}Ga_{38}$, 469 $HV_{0.01}$ was determined in the case of $Cu_{50}Ga_{50}$ and 142 $HV_{0.01}$ was determined in the case of $Cu_{34}Ga_{66}$.

TABLE 1

| Powder | Bulk density [g/cm³] | [%] | Tapped density [g/cm³] | [%] | FSSS [µm] | Flowability [sec/50 g] |
|---|---|---|---|---|---|---|
| Cu62Ga38 | 5.21 | 63.2 | 5.50 | 66.7 | 22.9 | 21.1 |
| Cu50Ga50 | 4.69 | 59.6 | 5.17 | 65.7 | 20.8 | 24.6 |
| Cu34Ga66 | 4.14 | 57.4 | 4.58 | 63.5 | 18.7 | 32.5 |

| Powder | Particle size (laser light scattering) | | |
|---|---|---|---|
| | d0.10 [µm] | d0.50 [µm] | d0.90 [µm] |
| Cu62Ga38 | 6.5 | 20.2 | 41.0 |
| Cu50Ga50 | 8.6 | 24.0 | 46.3 |
| Cu34Ga66 | 4.4 | 12.9 | 29.1 |

Figure 3:
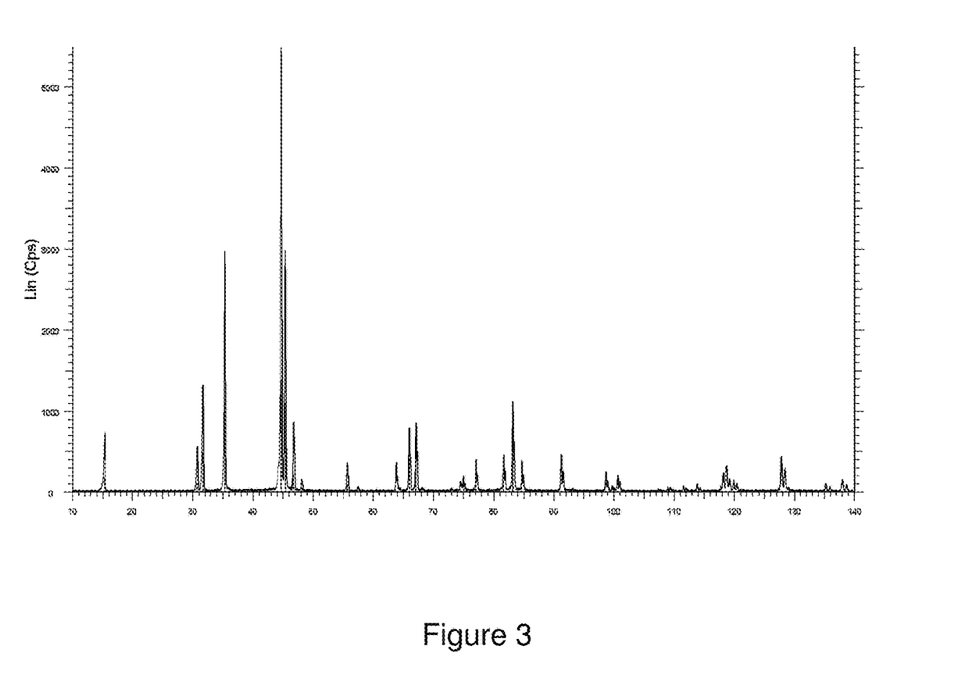
FIG. 3 shows the result of an XRD measurement on Cu—Ga powder according to the invention having a Ga content of 66 at %, balance Cu (concentration indicated in the figure in % by mass).

The phases were determined by means of XRD as described in detail in the description. In the case of the Cu62Ga38 powder, only $Cu_9Ga_4$ phase could be detected. The Cu50Ga50 powder comprises 48% by volume of $Cu_9Ga_4$ phase and 52% by volume of $CuGa_2$ phase. In the case of the Cu34Ga66 powder, only the $CuGa_2$ phase could be determined. The measurement result for Cu34Ga66 is shown in FIG. 3.

To study any phase transformations, DSC measurements were carried out. The Cu34Ga66 displayed an endothermic peak at about 260° C., which indicates the decomposition of $CuGa_2$ into $Cu_9Ga_4$ and melt. In addition, a pure Cu powder produced by atomization and having a particle size $d_{50}$ of 28 µm was also used for the experiments.

Figure 4:
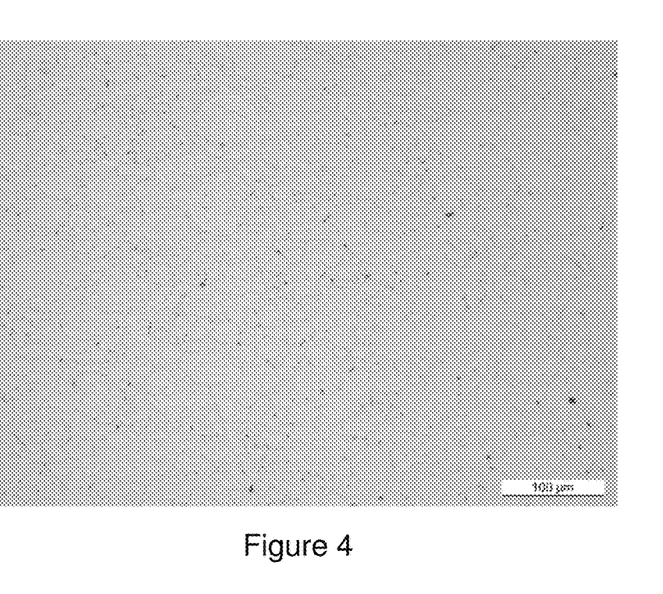
FIG. 4 shows an optical micrograph of a Cu—Ga sputtering target according to the invention having a Ga content of 58 at %, balance Cu.

Production of Compacted Specimens:
1. Production of comparative specimens by hot isostatic pressing (HIP):
    A specimen which was not according to the invention was produced by HIP using Cu62Ga38 powder. The powder was for this purpose introduced into a steel can and hot isostatically compacted at 500° C. The heating rate was 5 K/min, the hold time at 500° C. was 2 h and the pressure was 100 MPa. The compacted specimen was cooled at about 2 K/min. An attempt to part the compacted material by means of wire cutting led to cracks and chipping of the material. Only $Cu_9Ga_4$ phase was detected by means of the phase determination method presented in the description. The compacted body had a density of 8.2 g/cm³ (>99% of the theoretical density). The microhardness was, as presented in detail in the description, determined and was 628 HV0.01.
2. Production of comparative specimens by spark plasma sintering (SPS):
    A specimen which was not according to the invention was produced by SPS using Cu62Ga38 powder. The powder was for this purpose introduced into a graphite tool. The sintering operation was carried out under temperature control, with the temperature measurement being carried out by means of a thermocouple. The specimen was sintered by application of a DC voltage which led to heat evolution due to the Joule effect in the specimen.
    The following conditions were set:
    Heating rate: 10 K/min
    Sintering temperature: 300 and 450° C.
    Hold time: 10 min
    Pressure: 30 MPa
    The specimen sintered at 300° C. had a relative density of 81%, and the specimen sintered at 450° C. had a relative density of 99.3%. Neither specimen could be worked mechanically. Only $Cu_9Ga_4$ phase was detected by means of the phase determination method presented in the description. The microhardness was determined as indicated in the description and was 611 HV0.01.
3. Production of specimens according to the invention by spark plasma sintering (SPS):

The powder batches listed in Table 2 were densified by SPS. The process parameters are shown in Table 3. The determinations of the relative density, of the $CuGa_2$ to $Cu_9Ga_4$ ratio, of the Ga present as $CuGa_2$ and of the microhardness were carried out using the methods indicated in the description. The results are shown in Table 4. All specimens could be worked mechanically, with the workability being best in the case of the specimens in which the total Ga was present as $CuGa_2$. An optical micrograph is shown by way of example for specimen B in FIG. 4.

TABLE 2

| Specimen No. | Composition (at %/at %) | Components of the powder mixture |
|---|---|---|
| A | Cu34Ga66 | Only Cu34Ga66 powder ($CuGa_2$ phase) |
| B | Cu42Ga58 | Cu34Ga66 powder ($CuGa_2$ phase) + Cu powder |
| C | Cu42Ga58 | Cu34Ga66 powder ($CuGa_2$ phase) + Cu powder |
| D | Cu62Ga38 | Cu50Ga50 powder ($CuGa_2$ phase + $Cu_9Ga_4$ phase) + Cu powder |
| E | Cu70Ga30 | Cu50Ga50 powder ($CuGa_2$ phase + $Cu_9Ga_4$ phase) + Cu powder |
| F | Cu50Ga50 | Cu34Ga66 powder ($CuGa_2$ phase) + Cu powder |
| G | Cu42Ga58 | Cu34Ga66 powder ($CuGa_2$ phase) + Cu powder |
| H | Cu42Ga58 | Cu34Ga66 powder ($CuGa_2$ phase) + Cu—Ga mixed crystal powder (comprising 10% of the Ga of the sputtering target) |

TABLE 3

| Specimen No. | Heating rate [K/min] | Sintering temperature | Hold time at sintering temperature [min] | Pressure [MPa] |
|---|---|---|---|---|
| A | 10 | 230 | 10 | 30 |
| B | 10 | 230 | 20 | 40 |
| C | 10 | 230 | 30 | 22 |
| D | 10 | 230 | 30 | 22 |
| E | 20 | 230 | 1 | 40 |
| F | 20 | 230 | 1 | 40 |
| G | 30 | 230 | 1 | 40 |
| H | 10 | 230 | 20 | 40 |

TABLE 4

| Specimen No. | Relative density [%] | Microhardness [HV0.01] | Proportion by volume of $CuGa_2/Cu_9Ga_4$ | Ga present as $CuGa_2$ |
|---|---|---|---|---|
| A | 90.3 | 151 | No $Cu_9Ga_4$ detectable | 100% |
| B | 95.1 | 146 | No $Cu_9Ga_4$ detectable | 100% |
| C | 87.9 | 139 | No $Cu_9Ga_4$ detectable | 100% |
| D | 82.3 | 390 | 1.1 | about 75% |
| E | 88.1 | 410 | 1.1 | about 75% |
| F | 85.9 | 132 | No $Cu_9Ga_4$ detectable | 100% |
| G | 89.0 | 158 | No $Cu_9Ga_4$ detectable | 100% |
| H | 94.7 | 161 | No $Cu_9Ga_4$ detectable | 100% |

All specimens according to the invention displayed very uniform sputtering behaviour; the sputtering test is explained in detail below for specimen C. A sputtering target having a diameter of 105 mm was used for the experiments. The coating rate was comparable to specimens having a lower or higher Ga content. The coating rate at a power of 200 W was about 100 nm/min, that at 400 W was about 260 nm/min and that at 600 W was about 325 nm/min. Layers sputtered at 200 W and 400 W (Ar pressure of $2.5\times10^{-3}$ mbar, $5\times10^{-3}$ mbar and $7.5\times10^{-3}$ mbar) had low compressive stresses of <25 MPa. Layers sputtered at 600 W (Ar pressure of $2.5\times10^{-3}$ mbar, $5\times10^{-3}$ mbar and $7.5\times10^{-3}$ mbar) had low tensile stresses of <25 MPa. The phases in a layer deposited at 400 W were detected by means of an XRD measurement. 200 nm thick layers deposited on soda-lime glass were examined by scanning electron microscopy. The layers have a fine-grain microstructure, with the grain size increasing with decreasing power.

4. Production of comparative specimens by cold gas spraying (CGS):

A mixture of Cu62Ga38 (only $Cu_9Ga_4$ phase) and pure Cu powder was used to produce comparative specimens. The GA content of the mixture was 27 at %. The CGS parameters are summarized in Table 5.

TABLE 5

| Substrate | Austenitic steel tube |
|---|---|
| Activation of the surface | Blasting with $Al_2O_3$ |
| Process gas temperature | 450° C./800° C. |
| Process gas pressure | 29 bar/45 bar |
| Amount of process gas | 70-100 m³/h |

At a process gas temperature of 450° C., the Cu62Ga38 particles broke on impingement on the substrate. This resulted in crack formation and detachments between the individual layers of the coating and also in pore formation. In addition, chemical analysis showed that only a small proportion of the Cu62Ga38 particles had been incorporated into the layer (Ga content of the layer only 9 at %). It can be assumed that the remainder has bounced off the substrate or layer surface. Although increasing the process gas temperature to 800° C. had a favourable effect on incorporation of the Cu62Ga38 particles, it lead to blocking of the Laval nozzle after a short time.

5. Production of specimens according to the invention by cold gas spraying (CGS):

Specimens according to the invention were produced using a mixture of Cu50Ga50 powder (proportion by volume of $CuGa_2$>proportion by volume of $Cu_9Ga_4$) and pure Cu powder and also a mixture of Cu34Ga66 powder (only $CuGa_2$-phase) and pure Cu powder. The Ga content of the mixture was 38 at % (in the case of the Cu50Ga50-containing mixture) or 58 at % (in the case of the Cu34Ga66-containing mixture). The CGS parameters are summarized in Table 6.

Dense tube sections having a wall thickness of about 10 mm could be sprayed by means of both powder mixtures. After an annealing treatment at 200° C., the tube sections were worked mechanically. The sputtering target sections produced in this way had good bonding to the steel tube, which in use can assume the function of a support tube. The surface of the sputtering target was free of defects. The Ga content of the sputtering targets produced in this way corresponded to the Ga content of the powders used. The proportions of the phases in the sputtering target corresponded to the proportions of the phases in the powder. Initial exploratory sputtering tests displayed very homogeneous sputtering behaviour.

TABLE 6

| Substrate | Austenitic steel tube |
| --- | --- |
| Activation of the surface | Blasting with $Al_2O_3$ |
| Process gas temperature | 250° C. |
| Process gas pressure | 45 bar |
| Amount of process gas | 100 m$^3$/h |

The invention claimed is:

1. A sputtering target, comprising:
a target body consisting of Ga and Cu and, optionally, an amount of an alkali metal;
said Ga being present at a Ga content of from 30 to 68 at %; and
at least one Ga-containing and Cu-containing intermetallic phase selected from the group of intermetallic phases consisting of:
only $CuGa_2$, $CuGa_2$ plus pure Cu, $CuGa_2$ plus Ga-containing Cu mixed crystal, $CuGa_2$ plus pure Cu plus Ga-containing Cu mixed crystal, $CuGa_2$ plus other intermetallic Cu—Ga phases, $CuGa_2$ plus pure Cu plus other intermetallic Cu—Ga phases, $CuGa_2$ plus Ga-containing Cu mixed crystal plus other intermetallic Cu—Ga phases, and $CuGa_2$ plus pure Cu plus Ga-containing Cu mixed crystal plus other intermetallic Cu—Ga phases.

2. The sputtering target according to claim 1, which comprises regions having said at least one Ga-containing and Cu-containing intermetallic phase with an average microhardness of <500 HV0.01.

3. The sputtering target according to claim 1, wherein at least 90% of said Ga is present as $CuGa_2$.

4. The sputtering target according to claim 1, wherein said Ga content is from 40 to 68 at %.

5. The sputtering target according to claim 1, which further comprises a Cu-rich phase having a Cu content of >80 at % and being selected from the group consisting of pure Cu and Ga-containing Cu mixed crystal.

6. The sputtering target according to claim 5, wherein said Cu-rich phase is pure Cu.

7. The sputtering target according to claim 1, which further comprises >30% by volume of said $CuGa_2$.

8. The sputtering target according to claim 1, which further comprises a volume ratio of $CuGa_2/Cu_9Ga_4$ being >2.

9. The sputtering target according to claim 1, which further comprises a total of from 0.01 to 5 at % of at least one element selected from the group of alkali metals.

10. The sputtering target according to claim 1, wherein said at least one Ga-containing and Cu-containing intermetallic phase consists of only $CuGa_2$ or a proportion by volume of $CuGa_2$ is greater than a proportion by volume of $Cu_9Ga_4$.

* * * * *